(12) United States Patent
Worfolk et al.

(10) Patent No.: US 12,260,022 B2
(45) Date of Patent: Mar. 25, 2025

(54) INPUT DEVICE HAVING HAPTICS SENSING AND CORRECTIVE DEVICE SENSING

(71) Applicant: Synaptics Incorporated, San Jose, CA (US)

(72) Inventors: Patrick A. Worfolk, San Jose, CA (US); Stuart W. Hutson, Austin, TX (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 18/623,150

(22) Filed: Apr. 1, 2024

(65) Prior Publication Data

US 2024/0248540 A1     Jul. 25, 2024

Related U.S. Application Data

(63) Continuation of application No. 18/185,952, filed on Mar. 17, 2023, now Pat. No. 11,972,056.

(60) Provisional application No. 63/346,367, filed on May 27, 2022.

(51) Int. Cl.
| | |
|---|---|
| *G06F 3/01* | (2006.01) |
| *G06F 3/041* | (2006.01) |
| *G06F 3/044* | (2006.01) |
| *H10N 30/30* | (2023.01) |
| *H10N 30/80* | (2023.01) |

(52) U.S. Cl.
CPC ............ *G06F 3/016* (2013.01); *G06F 3/0418* (2013.01); *G06F 3/044* (2013.01); *H10N 30/302* (2023.02); *H10N 30/802* (2023.02)

(58) Field of Classification Search
None
See application file for complete search history.

(56) References Cited

U.S. PATENT DOCUMENTS

2011/0248916 A1* 10/2011 Griffin .................. G06F 3/0416
                                                                345/157

OTHER PUBLICATIONS

U.S. Appl. No. 18/185,952, filed May 17, 2023, Pending.

* cited by examiner

*Primary Examiner* — Stephen T. Reed
(74) *Attorney, Agent, or Firm* — Leydig, Voit & Mayer, Ltd.

(57) ABSTRACT

A method is provided. The method comprises obtaining, by a processing system and using a piezoelectric device, piezoelectric signals associated with user input on a sensing region of an input device; obtaining, by the processing system and using a corrective device, corrective signals associated with the user input on the sensing region of the input device; determining, by the processing system and based on the piezoelectric signals and the corrective signals, one or more events to be performed in response to the user input; and performing, by the processing system, the one or more events.

20 Claims, 6 Drawing Sheets

INPUT DEVICE HAVING HAPTICS SENSING AND CORRECTIVE DEVICE SENSING

CROSS-REFERENCE TO RELATED APPLICATIONS

This patent application is a continuation of and claims the benefit of U.S. patent application Ser. No. 18/185,952, filed on Mar. 17, 2023. This patent application also claims the benefit of U.S. Provisional Patent Application No. 63/346,367, filed May 27, 2022. Both of which are incorporated by reference herein in their entirety.

TECHNICAL FIELD

This disclosure relates generally to sensing touchpads, and more specifically to sensing touchpads integrated with piezoelectric devices and corrective devices (e.g., capacitive sensors).

BACKGROUND

Input devices such as touch sensor devices (also commonly called touchpads, forcepads, touch sensor devices, or other such devices), are widely used in a variety of electronic systems. Input devices typically include a sensing region, often demarked by a surface, in which the input device determines the presence, location, and/or motion of one or more input objects. Input devices may provide an input interface for an electronic system. For example, input devices may be used for larger electronic systems (such as opaque touchpads integrated in, or peripheral to, notebook or desktop computers). Input devices may also be used in smaller electronics systems (such as touch screens integrated in cellular phones).

Haptic devices may be configured to provide haptic feedback (e.g., audible and vibratory feedback) to a user. For instance, input devices may detect inputs by a user and supply haptic feedback such as audible feedback (e.g., sounds simulating a mouse click) and vibratory feedback (e.g., a slight vibration) indicating that an input was detected to the user. The haptic devices may be and/or include a piezoelectric device (e.g., a piezoelectric actuator). Piezoelectric devices can act as both actuators and sensors. However, it is difficult to solely use piezoelectric devices for static force measurements as there is a continuous loss of electrons from the fixed charge generated. As such, in certain situations, it is difficult for the piezoelectric devices to determine the proper response to the user input.

SUMMARY

This summary is provided to introduce a selection of concepts in a simplified form that are further described below. This summary is not intended to necessarily identify key features or essential features of the present disclosure. The present disclosure may include the following various aspects and embodiments.

In an exemplary embodiment, the present disclosure provides a method using a processing system of an input device. The method comprises obtaining, by a processing system and using a piezoelectric device, piezoelectric signals associated with user input on a sensing region of an input device; obtaining, by the processing system and using a corrective device, corrective signals associated with the user input on the sensing region of the input device; determining, by the processing system and based on the piezoelectric signals and the corrective signals, one or more events to be performed in response to the user input; and performing, by the processing system, the one or more events.

In another exemplary embodiment, the present disclosure provides an input device. The input device comprises one or more piezoelectric devices configured to measure piezoelectric signals associated with user input on a sensing region; one or more corrective devices configured to measure corrective signals associated with the user input on the sensing region; and a processing system. The processing system is configured to: obtain the piezoelectric signals; obtain the corrective signals; determine, based on the piezoelectric signals and the corrective signals, one or more events to be performed in response to the user input; and perform the one or more events.

In yet another exemplary embodiment, the present disclosure provides a non-transitory computer-readable medium having processor-executable instructions stored thereon, the processor-executable instructions, when executed, facilitating performance of the following: obtaining, using a piezoelectric device, piezoelectric signals associated with user input on a sensing region of an input device; obtaining, using a corrective device, corrective signals associated with the user input on the sensing region of the input device; determining, based on the piezoelectric signals and the corrective signals, one or more events to be performed in response to the user input; and performing the one or more events.

Further features and aspects are described in additional detail below with reference to the FIGS.

DETAILED DESCRIPTION

The following detailed description is exemplary in nature and is not intended to limit the disclosure or the application and uses of the disclosure. Furthermore, there is no intention to be bound by any expressed or implied theory presented in the preceding background, summary and brief description of the drawings, or the following detailed description.

In the following detailed description, numerous specific details are set forth in order to provide a more thorough understanding of the disclosed technology. However, it will be apparent to one of ordinary skill in the art that the disclosed technology may be practiced without these specific details. In other instances, well-known features have not been described in detail to avoid unnecessarily complicating the description.

Various examples of the present disclosure provide input devices and methods that integrate a piezoelectric device (e.g., a piezoelectric actuator and/or sensor) and a corrective device within the input device. For instance, there is a strong desire to use piezoelectric devices (e.g., actuators) in an input device (e.g., a haptics touchpad or forcepad) as these piezoelectric devices are thin and light. Since the piezoelectric devices may also be used as a transducer, it is very appealing to use the very same actuators as force sensors for detecting force. When a piezoelectric device deforms due to an applied force, it generates a voltage that may be measured. The sensing circuits may be integrated into the piezoelectric haptics driver using application-specific integrated circuits (ASIC). However, it is difficult to use piezoelectric devices for static measurements. For a fixed deformation, a certain amount of charge is displaced, resulting in a voltage that may be measured. But, this charge slowly leaks away regardless of user action or inaction, and the measured voltage decreases over time. Additionally, driving the piezoelectric device for the haptics functionality may disrupt force measurements. Furthermore, in certain instances, the applied force by a user may be determined using exact measurements from the piezoelectric device. However, any noise in these measurements or error in the sensor model may result in an accumulation of errors, leading to an inaccurate result.

Accordingly, the present disclosure describes an input device (e.g., a haptics forcepad) with electronic circuits that are configured to obtain corrective signals (e.g., capacitive measurements) that measure deflection of the printed circuit board assembly (PCBA) and/or voltage signals that measure deformation of a piezoelectric device (e.g., a piezoelectric actuator). Additionally, and/or alternatively, by taking the corrective signals in conjunction with the voltage signals, a processing system is capable of using the corrective signals and voltage signals to determine (e.g., estimate) an applied force or forces provided by a user. Additionally, and/or alternatively, the corrective device may be and/or include one or more capacitive sensors that are configured to measure the compression/deflection of the piezoelectric device (e.g., the piezoelectric transducers) and may even be integrated with the piezoelectric device.

For instance, examples of the present disclosure provide an input device that integrates a piezoelectric device with a corrective device (e.g., capacitive sensors). For example, an input device such as a portable device (e.g., laptop) may use touchpad and/or forcepad technology (e.g., a touchpad that includes finger pressure or force sensitivity) that uses a haptic actuator (e.g., a piezoelectric device) in order to generate an appropriate click to emulate the mechanical click of a regular touchpad. For instance, the forcepad may measure the force applied anywhere on the surface and when the force applied exceeds a threshold, a haptics actuator may provide haptic feedback as if there was a mechanical click. In other words, traditional touchpads may include a mechanical mechanism that provides a clicking noise and feeling as they are actuated and/or depressed. However, in some input devices (e.g., certain touchpads such as touchpads with the forcepad technology), when actuated or depressed, the input devices do not physically generate a clicking noise or feeling. Instead, a haptic device/haptic actuator such as a piezoelectric device is used to simulate the traditional clicking noise and feel, thereby providing haptic feedback that simulates the clicking noise and feel (e.g., vibration) of the traditional touchpads.

However, as mentioned above, using solely piezoelectric devices may encounter weaknesses in detecting certain types of user input as the resulting voltage measured for the piezoelectric device slowly leaks away over time. As such, in certain examples such as when a user pushes and holds the touch sensor, the piezoelectric device may initially generate a voltage that slowly leaks (e.g., reduces in magnitude) over time. This may be similar to output values as when a user pushes on the touch sensor and slowly releases the force over a time period, which makes it difficult for a processing system to differentiate between the different types of user input (e.g., user pushes and holds versus pushes and releases slowly). Accordingly, examples of the present application describe an input device (e.g., touchpad device or forcepad device) that uses a piezoelectric device along with another device (e.g., a corrective device such as capacitive sensors) to account for leakage of the piezoelectric device over time.

For instance, in some examples, the input device may include a corrective device such as one or more capacitive sensors. The capacitive sensors may compensate for the weaknesses of the piezoelectric device, and the capacitive sensing may already be included in the input device (e.g., the forcepad or touchpad), which reduces the requirement of incorporating a completely separate device/sensor to correct for the weaknesses of the piezoelectric device. However, using capacitive sensors by themselves as force sensors may also create difficulties in detecting user inputs. For instance, capacitive sensors that measure a force-induced deflection are very sensitive to manufacturing variation and need careful calibration. Accordingly, given the difficulty to calibrate these capacitive sensors, the input device might not be able to use the capacitive sensors by themselves either.

Accordingly, among other advantages, an input device that integrates both a piezoelectric device and a corrective device (e.g., capacitive sensors) may reduce the weaknesses of using these devices separately. For instance, the capacitive sensors may be used to correct for the weakness of using the piezoelectric device (e.g., the leakage of the voltage over time), and the piezoelectric device may be used to correct for the weakness of using the capacitive sensors (e.g., the difficulty of calibrating the capacitive sensors caused by the varying distance between the plates of the capacitive sensors, which may change the magnitude of the capacitive measurements/signals). In other words, the corrective device and the piezoelectric device may provide separate sensor signals/measurements, which may be used to cover the weaknesses of each device separately, and thus by using both the piezoelectric device and the corrective device, the input device may be able to ensure that the user inputs are correct.

Figure 1:
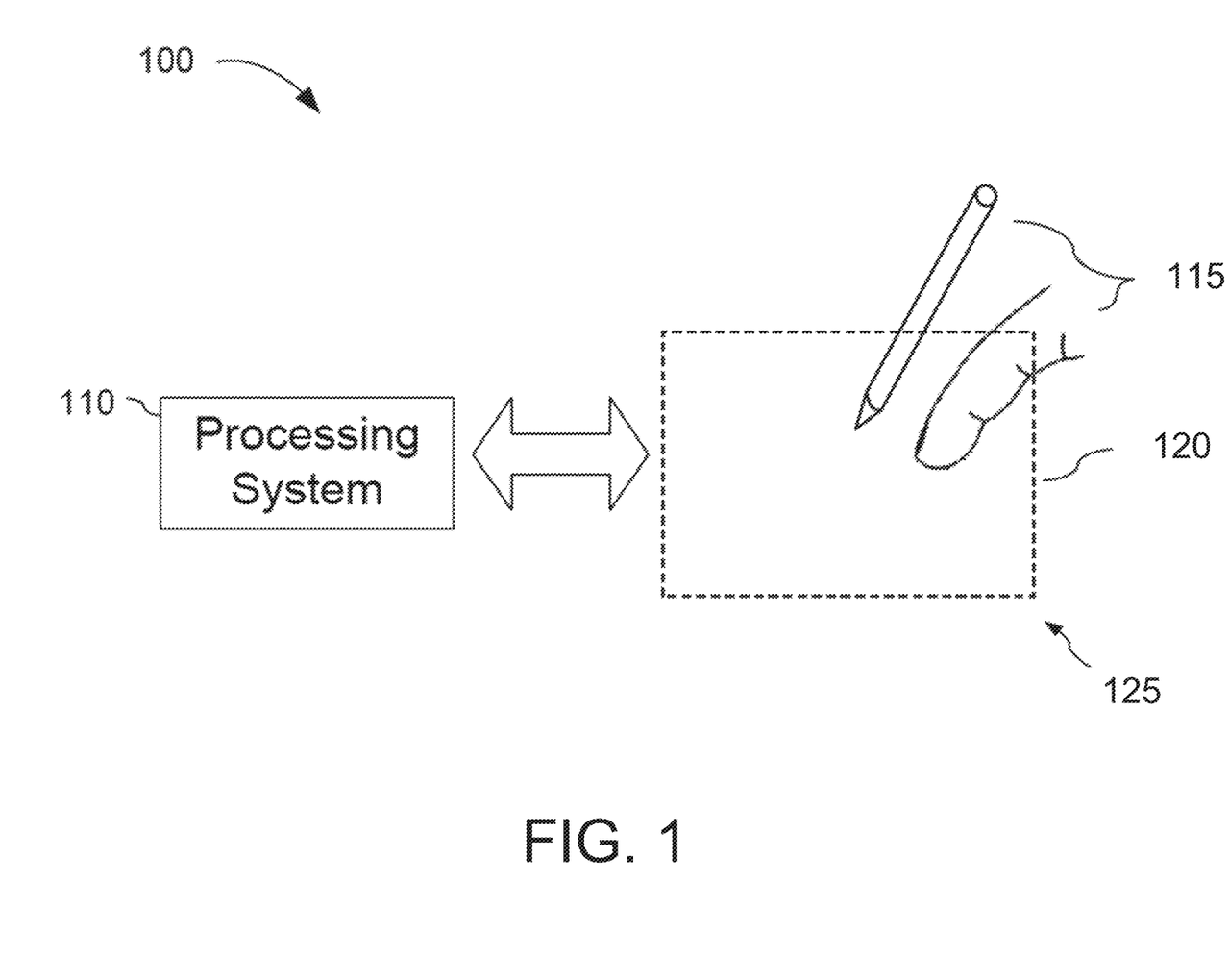
FIG. 1 is a block diagram depicting an input device according to one or more examples of the present disclosure.
Figure 2A:
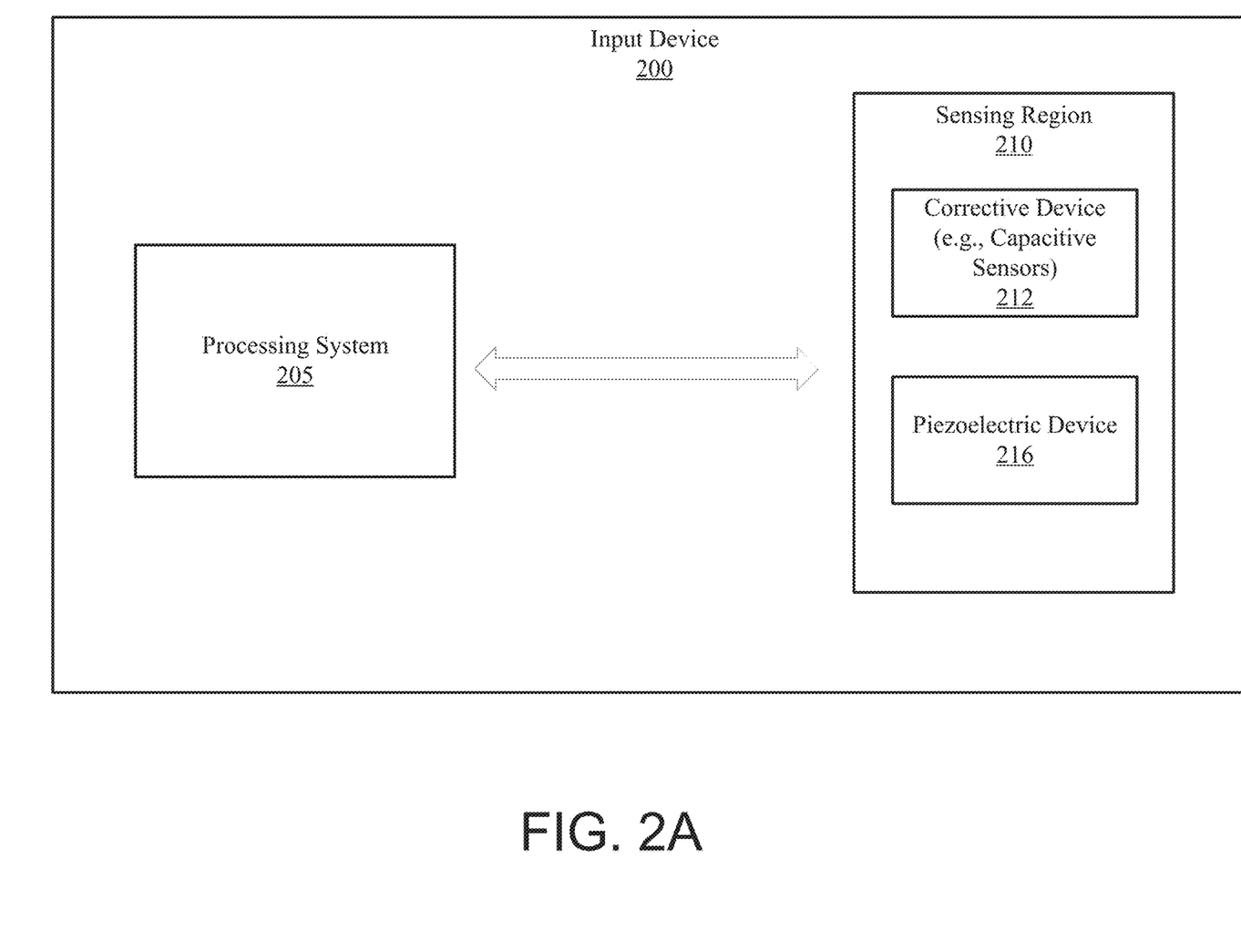
FIG. 2A is another block diagram depicting an input device according to one or more examples of the present disclosure.

FIG. 1 is a block diagram depicting an input device according to one or more examples of the present disclosure. The input device 100 may include a processing system 110, an input object 115, a sensing region 120, and touch sensors 125. For instance, the touch sensors 125 may include a corrective device (e.g., capacitive sensors) and/or a piezoelectric device, which are shown in FIG. 2A.

The input device 100 may be configured to provide input to an electronic system. As used herein, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, personal digital assistants (PDAs), and wearable computers (such as smart watches and activity tracker devices). Additional examples of electronic systems include composite input devices, such as physical keyboards that include input device 100 and separate joysticks or key switches. Further examples of electronic systems include peripherals such as data input devices (including remote controls and mice), and data output devices (including display screens and printers). Other examples include data output devices (e.g., display screens and printers), remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system may be a host or a slave to the input device.

The input device 100 may be implemented as a physical part of the electronic system, or can be physically separate from the electronic system. Alternatively, the input device 100 may be physically separated from the electronic system. As appropriate, the input device 100 may communicate with parts of the electronic system using any one or more of the following: buses, networks, and other wired or wireless interconnections. Examples include Inter-Integrated Circuit (I2C), Serial Peripheral Interface (SPI), Personal System/2 (PS/2), Universal Serial Bus (USB), Bluetooth, radio frequency (RF), and Infrared Data Association (IRDA).

In some examples, the input device 100 may correspond to a proximity sensor device (e.g., also referred to as a "touchpad" or "touch sensor device") configured to sense input provided by one or more input objects 115 in the sensing region 120. Example input objects 115 include fingers, styli, and the like. The sensing region 120 may encompass any space above, around, in, and/or proximate to the input device 100 in which the input device 100 is able to detect user input (such as provided by one or more input objects 115). The size, shape, and/or location of the sensing region 120 (e.g., relative to the electronic system) may vary depending on actual implementations.

Additionally, and/or alternatively, the input device 100 may correspond to a forcepad that includes functionality to perform proximity and/or force detection. Force detection is the ability to detect an amount of force applied to an input surface. Proximity detection is the ability to sense input provided by one or more input objects 115 in a sensing region 120. The touch sensors 125 may be used for force detection and/or proximity detection, and may be further used for haptic feedback control.

In some variations, the sensing region 120 extends from a surface of the input device 100 in one or more directions into space, for example, until a signal-to-noise ratio falls below a threshold suitable for object detection. For example, the distance to which this sensing region 120 extends in a particular direction, in various examples, may be on the order of less than a millimeter, millimeters, centimeters, or more, and may vary with the type of sensing technology used and/or the accuracy desired. In some instances, the input device 100 detects inputs involving no physical contact with any surfaces of the input device 100, contact with an input surface (e.g. a touch surface) of the input device 100, contact with an input surface of the input device 100 coupled with some amount of applied force or pressure, and/or a combination thereof.

In various examples, input surfaces may be provided by surfaces of a housing of the input device 100 within which the sensor electrodes reside, by face sheets applied over the sensor electrodes or any casings, etc. In some variations, the sensing region 120 has a rectangular shape when projected onto an input surface of the input device 100.

In some instances, the input device 100 may use various sensing technologies to detect user input. Example sensing technologies may include capacitive sensing technologies and/or other types of sensing technologies. In some examples, the input device 100 may use corrective devices such as one or more capacitive sensors to detect user input. For example, the sensing region 120 may include one or more capacitive sensing elements (e.g., sensor electrodes) to create an electric field. The input device 100 may detect inputs based on changes in capacitance of the sensor electrodes. For example, an object in contact with (or close proximity to) the electric field may cause changes in the voltage and/or current in the sensor electrodes. Such changes in voltage and/or current may be detected as "signals" indicative of user input. The sensor electrodes may be arranged in arrays or other configurations to detect inputs at multiple points within the sensing region 120. In some aspects, some sensor electrodes may be ohmically shorted together to form larger sensor electrodes. Some capacitive sensing technologies may use resistive sheets that provide a uniform layer of resistance.

Example capacitive sensing technologies may be based on "self-capacitance" (also referred to as "absolute capacitance") and/or "mutual capacitance" (also referred to as "transcapacitance"). Absolute capacitance sensing methods detect changes in the capacitive coupling between sensor electrodes and an input object. For example, an input object near the sensor electrodes may alter the electric field near the sensor electrodes, thus changing the measured capacitive coupling. In some variations, the input device 100 may implement absolute capacitance sensing by modulating sensor electrodes with respect to a reference voltage and detecting the capacitive coupling between the sensor electrodes and input objects. The reference voltage may be substantially constant or may vary. In some aspects, the reference voltage may correspond to a ground reference voltage.

In some instances, the input device 100 may use transcapacitance sensing technologies. Transcapacitance sensing methods detect changes in the capacitive coupling between sensor electrodes. For example, an input object or ground near the sensor electrodes may alter the electric field between the sensor electrodes, thus changing the measured capacitive coupling of the sensor electrodes. In some instances, the input device 100 may implement transcapacitance sensing by detecting the capacitive coupling between one or more transmitter sensor electrodes (also "transmitter electrodes" or "transmitter") and one or more receiver sensor electrodes (also "receiver electrodes" or "receiver"). Signals on the transmitter sensor electrodes may be modulated relative to a reference voltage (e.g., system ground) to transmit transmitter signals while receiver sensor electrodes may be held at a substantially constant voltage relative to the reference voltage to receive resulting signals. The reference voltage may be a substantially constant voltage or may be system ground. The resulting signal may be affected by environmental interference (e.g., other electromagnetic signals) as well as input objects or ground in contact with, or in close proximity to, the sensor electrodes.

The processing system 110 may be configured to operate the hardware of the input device 100 to detect input in the sensing region 120. In some instances, the processing system 110 may control one or more sensor electrodes to detect objects in the sensing region 120. For example, the processing system 110 may include parts of or all of one or more integrated circuits (ICs) and/or other circuitry components that are configured to transmit signals via one or more transmitter sensor electrodes and receive signals via one or more receiver sensor electrodes. In some aspects, one or more components of the processing system 110 may be co-located, for example, in close proximity to the sensing elements of the input device 100. In other aspects, one or more components of the processing system 110 may be physically separated from the sensing elements of the input device 100. For example, the input device 100 may be a peripheral coupled to a computing device, and the processing system 110 may be implemented as software executed by a central processing unit (CPU) of the computing device. In another example, the input device 100 may be physically integrated in a mobile device, and the processing system 110 may correspond, at least in part, to a CPU of the mobile device.

In some examples, the processing system 110 may be implemented as a set of modules that are implemented in firmware, software, or a combination thereof. Example modules include hardware operation modules for operating hardware such as sensor electrodes and display screens, data processing modules for processing data such as sensor signals and positional information, and reporting modules for reporting information. In some variations, the processing system 110 may include sensor operation modules configured to operate sensing elements to detect user input in the sensing region 120, identification modules configured to identify gestures such as mode changing gestures, and mode changing modules for changing operation modes of the input device 100 and/or electronic system.

The processing system 110 may operate the sensing elements of the input device 100 to produce electrical signals indicative of input (or lack of input) in the sensing region 120. The processing system 110 may perform any appropriate amount of processing on the electrical signals to translate or generate the information provided to the electronic system. For example, the processing system 110 may digitize analog signals received via the sensor electrodes and/or perform filtering or conditioning on the received signals. In some aspects, the processing system 110 may subtract or otherwise account for a "baseline" associated with the sensor electrodes. For example, the baseline may represent a state of the sensor electrodes when no user input is detected. Accordingly, the information provided by the processing system 110 to the electronic system may reflect a difference between the signals received from the sensor electrodes and a baseline associated with each sensor electrode.

In some examples, the sensing region 120 may also be the region that is activated by the haptics feedback. For instance, based on one or more obtained measurements, the processing system 110 provides haptic feedback to a user using the sensing region 120.

While FIG. 1 shows an exemplary configuration of components, other configurations may be used without departing from the scope of the disclosure. For example, various components may be combined to create a single component. As another example, the functionality performed by a single component may be performed by two or more components.

FIG. 2A is a block diagram depicting an input device according to one or more examples of the present disclosure. Referring to FIG. 2A, the input device 200 may be an example of the input device 100 of FIG. 1. The input device 200 may include a sensing region 210 and a processing system 205. The sensing region 210, which may be an example of the sensing region 120 of FIG. 1, may encompass any space above, around, in, and/or proximate to the input device 200 in which the input device 200 is able to detect user input, such as provided by one or more input objects (not shown for simplicity). The size, shape, and/or location of the sensing region 210 may vary depending on actual implementations.

The sensing region 210 may include a corrective device 212 (e.g., capacitive sensors) and a piezoelectric device 216 (e.g., a piezoelectric actuator). In some instances, the sensing region 210 may include a printed circuit board (PCB) assembly that includes the corrective device 212 and the piezoelectric device 216. The PCB assembly may include one or more PCBs.

The corrective device 212 may be any type of device, sensor, configuration, system, and/or other component that is configured to correct for the user input based on signals from the piezoelectric device 216. For instance, in some variations, the corrective device 212 may be a rectifying device that is used in connection with the piezoelectric device 216 to determine the user actions (e.g., the user input). For example, because the voltage of the piezoelectric sensors leaks over time regardless of user actions, the corrective device 212 may provide separate sensor signals that are used by the processing system 205 to determine the user actions (e.g., if a user actually released the input object from the sensing region 210 or if the user is still holding the input object on the sensing region 210). In some instances, the corrective device 212 may be used to correct for the signals provided by the piezoelectric device 216. In other instances, the piezoelectric device 216 may be used to correct for and/or calibrate the signals of the corrective device 212.

In some examples, the corrective device 212 is and/or includes one or more capacitive sensors. The capacitive sensors may include an array of sensor electrodes that create an electric field in and/or around the sensing region 210. The input device 200 may sense user inputs by detecting changes in capacitance and/or electric field through the corrective device 212 (e.g., the capacitive sensors). In some variations, the corrective device 212 (e.g., the capacitive sensors) may include transmitter sensor electrodes and receiver sensor electrodes (not shown for simplicity). In some instances, the corrective device 212 (e.g., the capacitive sensors) may be used as a force sensor (e.g., capable of detecting force of the user). The force may be a force value associated with the input object interacting with the sensor region 210.

The piezoelectric device 216 may be any type of device that uses piezoelectric sensing to detect user input and/or detect the force applied by the input object (e.g., the piezoelectric device 216 may be used as a force sensor). For instance, the piezoelectric device 216 may be a transducer. The piezoelectric device 216 may provide signals/measurements (e.g., voltage signals) associated with the input object/user input. For example, as mentioned previously, the piezoelectric device 216 may measure changes in applied force, but as the charge leaks over time, there may be issues when the applied force changes slowly, in quasi-static conditions.

Therefore, the piezoelectric device 216 is used in connection with the corrective device 212 (e.g., capacitive sensors) in order to detect the force applied by the input object and/or otherwise detect user input. For instance, the capacitive sensors may be used as force sensors, but these sensors directly measure a change in capacitance due to a deflection from an applied force but are very sensitive to manufacturing variation. The capacitive sensors may require complex calibration and sensing algorithms to map between measured capacitance and applied force. Therefore, the capacitive force sensors are integrated with the piezoelectric device 216 in the input device 200 (e.g., a piezoelectric haptics forcepad). Using the capacitive sensors in conjunction with the piezoelectric device 216 may achieve a higher performance force sensing.

The corrective device 212 and the piezoelectric device 216 may be coupled to the processing system 205. The processing system 205 may include hardware and/or software elements. The processing system 205 controls operation of the corrective device 212 and the piezoelectric device 216. For example, the corrective device 212 may include capacitive sensors and the processing system 205 may operate the capacitive sensors to determine a pressure and/or position associated with an input object (e.g., input object 115).

In some instances, the processing system 205 may include a touch controller or processor (e.g., a controller or processor configured to detect user input and/or perform actions). In other instances, the touch controller may be separate from the processing system 205. For example, the processing system 205 may include circuitry that couples or connects the touch controller with the capacitive sensors.

The piezoelectric device 216 may be coupled to the processing system 205. The processing system 205 may control the piezoelectric device 216 in order to detect force signals from the piezoelectric device 216 and/or provide haptic feedback to a user. For instance, the processing system 205 may provide haptic feedback in response to signals from the piezoelectric device 216 and the corrective device 212. In some instances, the processing system 205 may include circuitry and/or a processor or controller that is configured to detect the signals from the corrective device 212 and the piezoelectric device 216 and perform actions (e.g., providing haptic feedback).

Figure 2B:
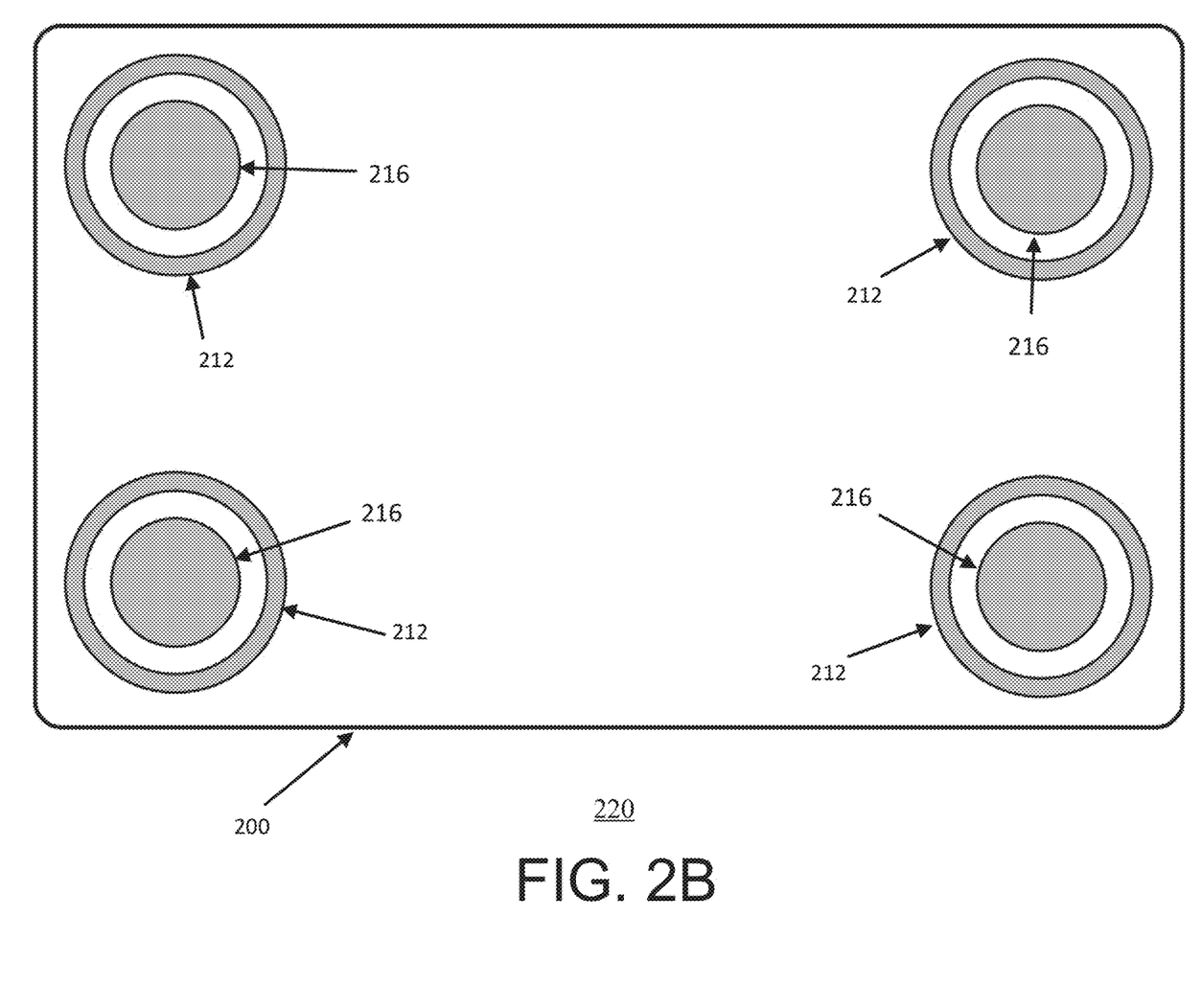
FIG. 2B shows a top view of an input device according to one or more examples of the present disclosure.

FIG. 2B shows a top view 220 of an input device 200 according to one or more examples of the present disclosure. For instance, the input device 200 includes four piezoelectric devices 216 (e.g., piezoelectric actuators) and four corrective devices 212 (e.g., capacitive sensors). Each piezoelectric device 216 is interior to one of the corrective devices 212.

Figure 2C:
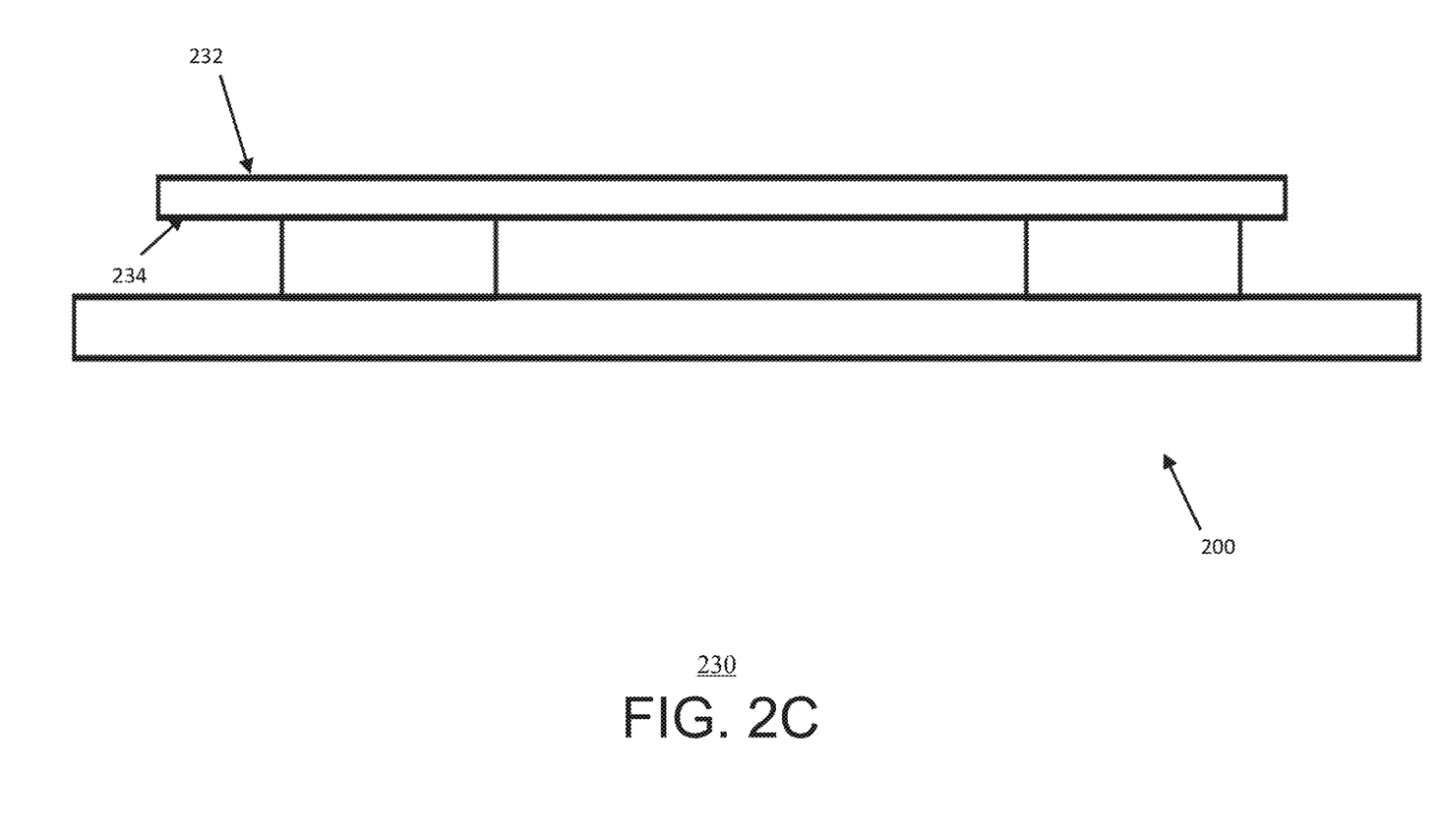
FIG. 2C shows a side view of an input device according to one or more examples of the present disclosure.

FIG. 2C shows a side view 230 of an input device 200 according to one or more examples of the present disclosure. For instance, as shown in side view 230, the input device 200 includes a touch sensor printed circuit board (PCB), piezoelectric transducers, and a mounting bracket. The capacitive touch electrodes 232 are shown on top and the capacitive corrective electrodes 234 (e.g., the corrective devices 212) are shown at the bottom.

Figure 3:
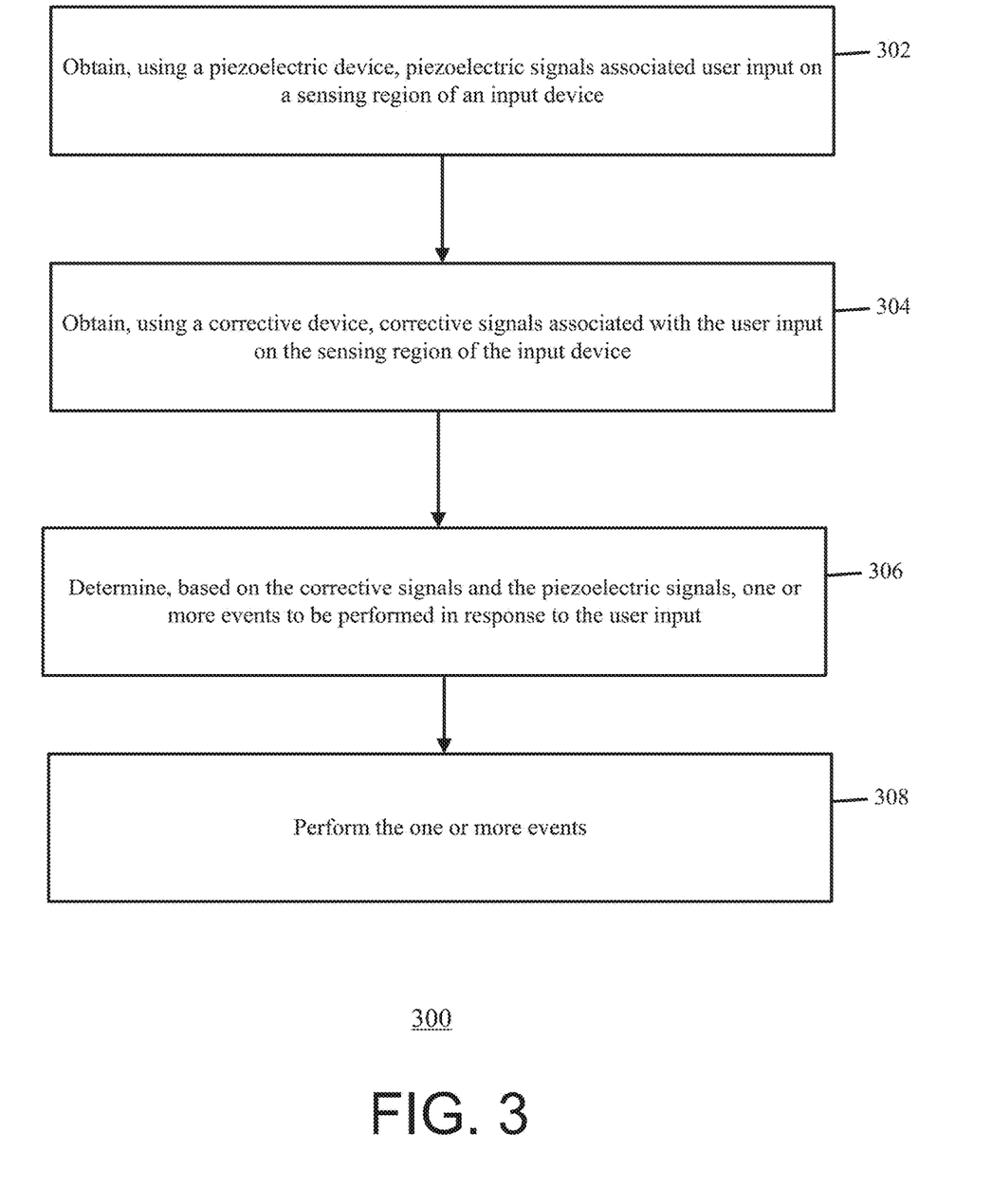
FIG. 3 is a flowchart of an exemplary process for using an input device including a piezoelectric device and a corrective device according to one or more examples of the present disclosure.

FIG. 3 is a flowchart of an exemplary process 300 for using an input device including a piezoelectric device and a corrective device according to one or more examples of the present disclosure. The process 300 may be performed by the input device 100 or 200 and in particular, the processing system 110 or 205 shown in FIGS. 1 and 2A. However, it will be recognized that an input device that includes additional and/or fewer components as shown in FIGS. 1 and 2A may be used to perform process 300, that any of the following blocks may be performed in any suitable order, and that the process 300 may be performed in any suitable environment. The descriptions, illustrations, and processes of FIG. 3 are merely exemplary and the process 300 may use other descriptions, illustrations, and processes for using an input device that includes a piezoelectric device and a corrective device.

In operation, at block 302, the processing system 205 obtains, using a piezoelectric signals associated with user input on a sensing region of an input device. For instance, the user may use an input object (e.g., input object 115) to provide user input on a sensing region (e.g., sensing region 120 or 210) on an input device (e.g., input device 100 or 200). The processing system 205 may obtain piezoelectric signals associated with the user input. For example, when the user presses down to the sensing region of the input device, the piezoelectric device 216 may deflect (e.g., a bending of the material) and/or depress from this action. Based on the deflection and/or depression, the piezoelectric device 216 may generate signals (e.g., voltage signals) that are provided to the processing system 205.

Figure 4:
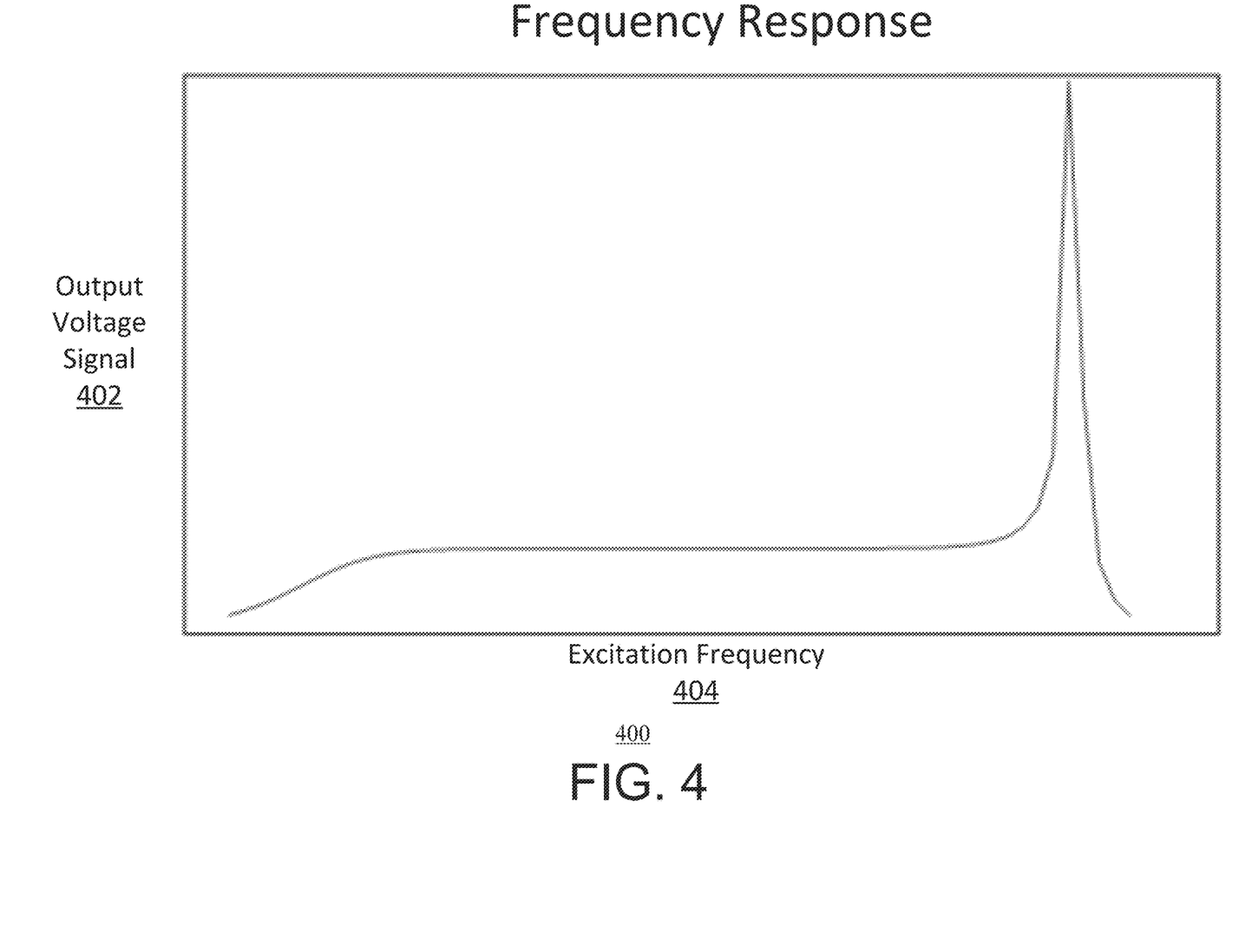
FIG. 4 is a graphical representation for a frequency response for a piezoelectric force sensor according to one or more examples of the present disclosure.

FIG. 4 is a graphical representation for a frequency response for a piezoelectric force sensor according to one or more examples of the present disclosure. For instance, FIG. 4 shows a graph 400 that shows the magnitude of the output voltage signal 402 of the piezoelectric device 216 on the y-axis as a function of the excitation frequency 404 on the x-axis. For example, if the user provides a sinusoidal signal with a fixed amplitude, then the piezoelectric device 216 provides a sinusoidal output signal at that frequency with the indicated magnitude. In the horizontal flat region prior to the peak, the magnitude of the output is relatively independent of the frequency. At lower frequencies, the magnitude of the output signals decrease to zero. As such, if the force is slowed down, even if the force is the same, then there is no or very little output signal. At high frequencies, which might not occur on a touchpad/forcepad, a resonant peak is provided. Accordingly, as shown, the piezoelectric device 216 operates normally (e.g., an output voltage is provided based on the frequency of the user input) at a horizontal flat region, but at a lower frequency (e.g., during static or quasi-static conditions such as when the user is slowly releasing from the sensing region), little to no voltage signals may be detected.

Therefore, in view of the output profile of the piezoelectric device 216 shown in FIG. 4, the processing system 205 may use a further signal from another device/sensor such as the corrective device 212 to determine the user input. At block 304, the processing system 205 obtains, using a corrective device, corrective signals associated with the user input on the sensing region of the input device. In other words, for the same user action (e.g., the user pressing down on the sensing region), the processing system 205 may obtain two separate signals—one set from the corrective device 212 and one set from the piezoelectric device 216. As mentioned previously, in some instances, the corrective device 212 includes one or more capacitive sensors. As such, at block 304, the processing system 205 may obtain capacitive signals from the capacitive sensors. In some instances, the capacitive signals may be mapped to roughly calibrated force signals. For example, the processing system 205 may obtain measurements/signals from the capacitive sensors and convert these measurements/signals into force measurements.

At block 306, the processing system 205 determines, based on the corrective signals and the piezoelectric signals, one or more events to be performed in response to the user input. At block 308, the processing system 205 performs the one or more events. The one or more events may be and/or include providing haptic feedback to the user, which is described above. For instance, the processing system 205 may compare the piezoelectric and corrective signals with one or more thresholds, and provide haptic feedback to the user based on the comparison.

For example, the user may use the input object to provide user input such as pressing down (e.g., pushing down) on the sensing region. The piezoelectric device 216 may provide a voltage signal based on this action, but the signal may slowly leak away (e.g., reduce in magnitude). The capacitance sensors may provide capacitive signals that remain constant while the applied force is constant, but the capacitive signals may not be mapped to force values. As such, by using both signals, the processing system 205 may correct for any weaknesses of both sensors and provide appropriate feedback to the user. For instance, the initial signals (e.g., force values) of the piezoelectric device 216 may be reliable even though later on, as the signal leaks, it is not as reliable. Further, whereas the capacitive signals may not represent a force measurement, they are directly related to the applied force. For example, the user may apply 0.5 Newtons (N) of force on the sensing region. The piezoelectric device 216 may provide a piezoelectric signal indicating the 0.5 N of force (e.g., a first magnitude of the voltage signal at a first time instance). The output of the capacitive sensor(s) may be a first value (e.g., "X") that may be different from the piezoelectric signal. The user may continue holding this force value on the sensing region. During this span, the piezoelectric device 216 may leak voltage so that the piezoelectric signal gradually reduces and it is difficult to differentiate between this leakage and a decrease in force value (e.g., determining the magnitude of the voltage signal decreases from the first magnitude over a period of time). However, during this same time span, the capacitance signal detected by the capacitive sensors may still remain substantially constant, e.g., still reading X indicating that the drop is voltage is likely substantially due to leaking charge and not a decrease in applied force. Therefore, initially, the processing system 205 may use the piezoelectric device 216 to perform an event (e.g., provide first haptic feedback for a "click"). For instance, the processing system 205 may compare the voltage signal indicated by the piezoelectric signal (e.g., 0.5 N of force) at a first instance in time with a threshold (e.g., a first threshold). Based on the comparison, the processing system 205 may determine to perform the first haptic feedback.

Afterwards, the processing system 205 may use the capacitive sensors for a subsequent event (e.g., provide second haptic feedback for an "unclick", which denotes the user releasing the input object from the sensing region). For example, the user may slowly release the input object from the sensing region. At a certain threshold (e.g., 0.25 N), the processing system 205 may perform the subsequent event. However, due to the leakage of the piezoelectric signal, the processing system 205 might not be capable of ensuring this subsequent event occurred. For instance, it is difficult to determine whether the user releases slowly as it would have a similar output voltage profile as if the user holds for a certain amount of time. Therefore, the processing system 205 may use the capacitive sensors to determine whether the user actually released or is still holding. For instance, if the user releases slowly, the capacitive signals provided by the capacitive sensors would indicate a slow release (e.g., a slow reduction from X to another value such as 0.5*X). If the user holds, the capacitive signals would remain substantially constant (e.g., remain at X). Accordingly, the processing system 205, using the initial capacitance value detected by the capacitive sensors (e.g., 0.9 N), may determine a new threshold value (e.g., a corrective threshold). For instance, the processing system 205 may rely on the proportions of the capacitive signals to remain substantially constant. Therefore, given the 0.25 N threshold and the initial piezoelectric signal of 0.5 N, the processing system 205 may determine a new corrective threshold for the capacitance signal such as 0.5*X (e.g., half of the initial amount detected by the capacitive sensors). In some instances, the comparison between the piezoelectric signal and the capacitive signal might not be completely linear (e.g., reduction by half given the 0.5 N initial value and 0.25 N threshold). Therefore, the processing system 205 may determine the new corrective threshold based on the initial capacitance signal (e.g., X) and a non-linearity factor. For instance, the processing system 205 may use a non-linearity factor of 65% or 70%. Therefore, the processing system 205 may determine the new corrective threshold as 0.65*X or 0.7*X. The processing system 205 may perform the one or more events (e.g., the unclicking haptic feedback event) based on the corrective threshold (e.g., when the capacitance signal reaches the corrective threshold). In some variations, the processing system 205 may determine the corrective threshold based on the initial capacitance value and/or using one or more formulas, look-up tables, and/or other algorithms. For instance, the processing system 205 may use a look-up table to determine the corrective threshold from the initial capacitance value.

In some examples, the processing system 205 may use the corrective device 212 for the secondary event (e.g., providing the "unclicking" haptic feedback to the user). For instance, the processing system 205 may compare the capacitive signal with the corrective threshold to determine whether to perform the event. In other examples, the processing system 205 may use both the corrective device 212 and the piezoelectric device 216 for the secondary event such as the "unclicking" event. For example, the piezoelectric device 216 may detect sudden movement or action by the user as mentioned above. Therefore, the processing system 205 may use the capacitive sensor signals as a corrective or secondary check to determine whether the user action is accurate. For instance, based on the piezoelectric device 216 indicating the unclick event (e.g., when the piezoelectric signal reaches the 0.25 N threshold), the processing system 205 may determine the value of the capacitive signal at that time. Based on the capacitive signal remaining substantially constant, the processing system 205 may determine that the reduction of the piezoelectric signal was caused by the leakage and not by the user releasing from the sensor region. As such, the processing system 205 might not provide the haptic feedback to the user. Based on the capacitive signal being reduced by a certain percentage (e.g., reducing to the new corrective threshold and/or reducing to a different value), the processing system 205 may determine the reduction of the piezoelectric signal was caused by the user, and may perform an event such as providing the haptic feedback.

In some instances, the processing system 205 may determine a new corrective threshold for the corrective device 212 for each separate user input. For instance, based on where the user presses on the sensing region, the capacitive sensor may provide a different magnitude value. For instance, if the user presses on the center portion of the sensing region, the capacitive sensors may detect a first signal such as a value (e.g., "Y") whereas if the user presses on an edge portion of the sensing region, the capacitive sensors may detect a second signal such as 0.8*Y. Accordingly, the processing system 205 may determine a new corrective threshold for each user input.

In some examples, the processing system 205 may track historical data associated with the piezoelectric signals and/or the corrective signals. For instance, the processing system 205 may determine key points in history, and use those key point as trigger points (e.g., when the processing system 205 performs the haptic events such as when the haptic events are performed based on the corrective signals being below the corrective threshold). The trigger points may be associated with one or more force thresholds, which are used to determine whether to perform the one or more events. For example, the historical data may track how fast the piezoelectric signal decays over time. Based on the historical data, the processing system 205 may determine whether to perform the one or more events. For instance, if the comparison of the historical data indicating normal decay of the piezoelectric signal and the current data associated with the current piezoelectric signal is similar, the processing system 205 may determine the piezoelectric signal is decaying normally and might not perform the one or more events. If the comparison of the historical data indicating normal decay of the piezoelectric signal and the current data associated with the current piezoelectric signal is substantially different (e.g., statistically significant to a certain threshold value or statistical value), the processing system 205 may determine the piezoelectric signal is not decaying normally and may perform the one or more events.

In some variations, the piezoelectric signals may be used to perform an initial calibration of the capacitance sensors. For instance, the capacitance sensors may be calibrated and remain calibrated for a certain amount of time after the calibration. As such, based on the piezoelectric signals (e.g., 0.5 N for the piezoelectric signals indicating what applied force corresponds to a value of X for the capacitive signals), the processing system 205 may calibrate the capacitance signals. For instance, based on a magnitude of the piezoelectric signals and corrective signals at a first instance in time, the processing system 205 may calibrate the corrective device 212.

In some instances, such as in drawing applications, it is useful to vary input pressure to change a drawing effect, such as line thickness. As such, the processing system 205 may use the piezoelectric signals and corrective signals to determine the variations in applied pressure, and adjust the drawing effect (e.g., line thickness) accordingly. For instance, as pressure is applied in a rapidly changing manner, the processing system 205 may obtain simultaneous measurements of the piezoelectric signals and the corrective signals. The piezoelectric signals may be mapped to forces, which then may provide a mapping for the corrective signals to forces. This corrective signal to force mapping may be used to determine variations in applied pressure while the pressure changes are slowly changing. In some instances, the processing system 205 may refine the force mapping over multiple drawing events. Additionally, and/or alternatively, the processing system 205 may provide more weight to recent drawing events and less weight to older events when applying the force mapping.

In some examples, the present disclosure may be used for clicking after pointing. For instance, if the user has been applying light pressure while pointing, the piezoelectric device 216 may lose track of the light force making it difficult to click at the specified click threshold. To provide a uniform experience for the user, the capacitive sensors may track the relative force during the pointing interactions and make sure that when the user intends to click, that the click occurs at the user expected threshold.

In some variations, if the applied force changes during a haptics event, then the piezoelectric device might not detect this change in force. The capacitive sensor may track the applied force during this event and serve as a reference to restart the piezoelectric sensing. For instance, the capacitance sensor may detect a first value (e.g., Z) at the start of the haptics event and a second value (e.g., 0.5*Z) at the end of the haptics event. As such, based on the reduction by 50%, the processing system 205 may estimate the change in force accordingly during the haptics event (e.g., a 50% reduction).

In some instances, if all the piezoelectric device/actuators are driven and sensed using a single channel, then there is a single force measurement. The capacitive deflection measurements may be used to estimate force per finger. The processing system 205 may use this to enable a click gesture to be recognized while a palm is resting on the sensing region of the input device. For instance, in order to be able to estimate force per finger (or contact area), the processing system 205 may obtain a history of contact points and simultaneous piezoelectric measurements and capacitive deflection measurements. For example, if a user were to put two fingers on the touch pad on opposite edges, then pushing on one edge is going to cause greater deflections near that edge while pushing on the opposite edge will cause greater deflections near that opposite edge. A model of the deflection of the input device 200 (e.g., the sensing region 210) and how applied forces at different positions result in different capacitive deflection measurements allow for the processing system 205 to determine (e.g., create) an inverse model that maps the capacitive deflection measurements plus contact points to a force per contact point. Thus, as piezoelectric measurements indicate an increase in applied force, using the capacitive deflection measurements and the inverse model, the processing system 205 may determine whether, for example, the increase in force is coming from the large contact patch that is a palm resting on one part of the touchpad or the smaller contact patch that is a finger making contact in a different area of the touchpad.

In some examples, when the piezoelectric device is calibrated, typically through applying known forces at a set of test points, then the capacitive sensors may be linearized. The capacitive sensors may have a nonlinear response to deflection. As such, the processing system 205 may generate a simple model that linearizes each of the sensor's response to the applied force. This makes the above described functions simpler. This is much simpler than the calibration required if the capacitive sensors were the only sensors present.

In some variations, the processing system 205 may use the piezoelectric signals (e.g., the piezoelectric force measurements) to periodically recalibrate the capacitive force sensing. For example, if a single finger is down in a position directly over one of the capacitive sensors, then it can be used to recalibrate that capacitive sensor(s). The processing system 205 may obtain a sequence of simultaneous piezoelectric signals and capacitive signals. With the finger directly over the capacitive sensor (or in other calibration positions), the processing system 205 may use the force values corresponding to piezoelectric signals to update a mapping from the capacitive signals to force values. Additionally, and/or alternatively, the processing system 205 may use the capacitive force sensing to determine whether the piezoelectric device 216 needs calibration and/or calibrate the piezoelectric device 216.

In some instances, the corrective device 212 may be alternate force sensors such as a strain gauge. A strain gauge typically measures a change in resistance due to strain from the deflection of the object it is attached too. The deflection is due to an applied force, but it is often not straightforward to calibrate the mapping between applied force and the change in resistance measured by the strain gauge. By taking a sequence of simultaneous measurements from the piezoelectric device 216 and the strain gauge as a force is applied in a rapidly changing manner, the processing system 205 may use the forces measured via the piezoelectric device 216 to calibrate the strain gauge. In some examples, the corrective device 212 may monitor the piezoelectric device 216. Once the corrective device 212 is calibrated, the corrective device 212 may be used to detect a deviation in measured force from the piezoelectric device 216. In some examples, additional and/or alternative sensors (e.g., sensors additional to or other than capacitive sensors) may be used to monitor the piezoelectric device and compensate for their inherent weaknesses. By understanding how the piezoelectric device 216 may deviate over time, use, and operating conditions, the combination of piezoelectric and corrective devices 216 and 212 may be used by the processing system 205 to best measure this deviation and correct the different force mappings.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Exemplary embodiments are described herein. Variations of those exemplary embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method, comprising:
    obtaining, by a processing system, two sets of signal associated with a same user input on a sensing region of an input device, wherein the two sets of signals comprise a first set of signals that are piezoelectric signals obtained from a piezoelectric device and a second set of signals that are corrective signals obtained from a corrective device that is separate from the piezoelectric device;
    determining, by the processing system and based on the piezoelectric signals and the corrective signals, one or more events to be performed in response to the user input; and
    performing, by the processing system, the one or more events.

2. The method of claim 1, wherein the first set of signals comprise a plurality of piezoelectric signals obtained from a plurality of piezoelectric devices, wherein the corrective device comprises a plurality of capacitive sensors, and wherein each of the plurality of capacitive sensors is associated with a respective piezoelectric device from the plurality of piezoelectric devices.

3. The method of claim 1, wherein performing the one or more events to be performed in response to the user input comprises providing haptic feedback to a user in response to the user input.

4. The method of claim 1, wherein determining the one or more events comprises: determining to provide first haptic feedback based on a first magnitude of piezoelectric measurements at a first instance in time exceeding a first threshold, and wherein performing the one or more events comprises providing the first haptic feedback to a user.

5. The method of claim 4, wherein determining the one or more events to be performed in response to the user input further comprises:
    determining a corrective threshold for the corrective signals based on the first magnitude of the piezoelectric measurements at the first instance in time;
    comparing the corrective signals with the corrective threshold; and
    determining to provide second haptic feedback based on the comparison, and
    wherein performing the one or more events further comprises providing the second haptic feedback to the user.

6. The method of claim 5, wherein determining the corrective threshold for the corrective signals comprises:
    determining, from the corrective signals, an initial capacitance value associated with the first instance in time; and
    determining the corrective threshold based on the initial capacitance value.

7. The method of claim 5, wherein determining to provide the second haptic feedback comprises:
    determining that the piezoelectric measurements indicate a reduction of magnitude from the first magnitude over a period of time;
    determining that the corrective signals indicate at least one capacitance value that is below the corrective threshold; and
    determining to provide the second haptic feedback based on the reduction of magnitude from the first magnitude over the period of time and the at least one capacitance value that is below the corrective threshold.

8. The method of claim 4, wherein determining the one or more events to be performed in response to the user input further comprises:
    determining that the piezoelectric measurements indicate a reduction of magnitude from the first magnitude over a period of time;
    determining the corrective signals indicate that capacitance values indicated by the corrective signals remain substantially unchanged over the period of time based on comparing the capacitance values with a corrective threshold; and determining to not provide second haptic feedback based on the reduction of magnitude from the first magnitude over the period of time and the capacitance values remaining substantially unchanged over the period of time.

9. The method of claim 1, further comprising:
generating historical data based on the piezoelectric signals, the corrective signals, and performing the one or more events, wherein the historical data comprises one or more force thresholds indicating a normal decay of the piezoelectric signals;
obtaining, using the piezoelectric device, new piezoelectric signals associated with a new user input;
determining to perform a new haptic event based on comparing the new piezoelectric signals with the historical data indicating the normal decay of the piezoelectric signals; and
performing the new haptic event.

10. The method of claim 1, wherein determining the one or more events to be performed in response to the user input comprises:
determining a magnitude of the piezoelectric signals at a first instance in time;
determining a magnitude of the corrective signals at the first instance in time; and
determining to calibrate the corrective device based on the magnitude of the piezoelectric signals and the magnitude of the corrective signals; and
wherein performing the one or more events comprises calibrating the corrective device.

11. The method of claim 1, wherein the corrective device is a strain gauge.

12. An input device, comprising:
one or more piezoelectric devices configured to measure piezoelectric signals;
one or more corrective devices configured to measure corrective signals; and
a processing system configured to:
obtain two sets of signals associated with a same user input on a sensing region, wherein the two sets of signals comprise a first set of signals that are the piezoelectric signals obtained from the one or more piezoelectric devices and a second set of signals that are corrective signals obtained from the one or more corrective devices;
determine, based on the piezoelectric signals and the corrective signals, one or more events to be performed in response to the user input; and
perform the one or more events.

13. The input device of claim 12, wherein determining the one or more events comprises: determining to provide first haptic feedback based on a first magnitude of piezoelectric measurements at a first instance in time exceeding a first threshold, and wherein performing the one or more events comprises providing the first haptic feedback to a user.

14. The input device of claim 13, wherein determining the one or more events to be performed in response to the user input further comprises:
determining a corrective threshold for the corrective signals based on the first magnitude of the piezoelectric measurements at the first instance in time;
comparing the corrective signals with the corrective threshold; and
determining to provide second haptic feedback based on the comparison, and
wherein performing the one or more events further comprises providing the second haptic feedback to the user.

15. The input device of claim 14, wherein determining the corrective threshold for the corrective signals comprises:
determining, from the corrective signals, an initial capacitance value associated with the first instance in time; and
determining the corrective threshold based on the initial capacitance value.

16. The input device of claim 14, wherein determining to provide the second haptic feedback comprises:
determining that the piezoelectric measurements indicate a reduction of magnitude from the first magnitude over a period of time;
determining that the corrective signals indicate at least one capacitance value that is below the corrective threshold; and
determining to provide the second haptic feedback based on the reduction of magnitude from the first magnitude over the period of time and the at least one capacitance value that is below the corrective threshold.

17. The input device of claim 13, wherein determining the one or more events to be performed in response to the user input further comprises:
determining that the piezoelectric measurements indicate a reduction of magnitude from the first magnitude over a period of time;
determining the corrective signals indicate that capacitance values indicated by the corrective signals remain substantially unchanged over the period of time based on comparing the capacitance values with a corrective threshold; and
determining to not provide second haptic feedback based on the reduction of magnitude from the first magnitude over the period of time and the capacitance values remaining substantially unchanged over the period of time.

18. The input device of claim 12, wherein the processing system is further configured to:
generate historical data based on the piezoelectric signals, the corrective signals, and performing the one or more events, wherein the historical data comprises one or more force thresholds indicating a normal decay of the piezoelectric signals;
obtain, using the one or more piezoelectric devices, new piezoelectric signals associated with a new user input;
determine to perform a new haptic event based on comparing the new piezoelectric signals with the historical data indicating the normal decay of the piezoelectric signals; and
perform the new haptic event.

19. The input device of claim 12, wherein the one or more corrective devices comprise a plurality of capacitive sensors or one or more strain gauges.

20. A non-transitory computer-readable medium having processor-executable instructions stored thereon, the processor-executable instructions, when executed, facilitating performance of the following:
obtaining two sets of signals associated with a same user input on a sensing region of an input device, wherein the two sets of signals comprise a first set of signals that are piezoelectric signals obtained from a piezoelectric device and a second set of signals that are corrective signals obtained from a corrective device that is separate from the piezoelectric device;

determining, based on the piezoelectric signals and the corrective signals, one or more events to be performed in response to the user input; and performing the one or more events.

\* \* \* \* \*

UNITED STATES PATENT AND TRADEMARK OFFICE
CERTIFICATE OF CORRECTION

| | | |
|---|---|---|
| PATENT NO. | : 12,260,022 B2 | Page 1 of 1 |
| APPLICATION NO. | : 18/623150 | |
| DATED | : March 25, 2025 | |
| INVENTOR(S) | : Patrick A. Worfolk et al. | |

It is certified that error appears in the above-identified patent and that said Letters Patent is hereby corrected as shown below:

In the Claims

At Column 15: Line 63, Claim 1, please delete:
"signal"

And please add:
--signals--

Signed and Sealed this
Twenty-second Day of April, 2025

Coke Morgan Stewart
*Acting Director of the United States Patent and Trademark Office*